United States Patent [19]

Tanaka et al.

[11] Patent Number: 5,656,383
[45] Date of Patent: Aug. 12, 1997

[54] COATED MEMBER HAVING EXCELLENT HARDNESS AND, ADHESIVE PROPERTIES

[75] Inventors: Yusuke Tanaka; Taiitsu Aoki; Yasuyuki Yamada; Masahiro Machida; Takeo Komine; Yasushi Onishi, all of Akashi, Japan

[73] Assignee: Kabushiki Kaisha Kobe Seiko SHO, Kobe, Japan

[21] Appl. No.: 432,810

[22] Filed: May 2, 1995

[30] Foreign Application Priority Data

May 13, 1994 [JP] Japan ................................ 6-100152

[51] Int. Cl.$^6$ ............................ B23B 51/00; B23B 27/04; B23B 15/04
[52] U.S. Cl. ......................... 428/627; 428/651; 428/654; 428/660; 428/697; 428/698
[58] Field of Search ....................... 428/651, 652, 428/653, 627, 660, 654, 650, 628, 621, 689, 681, 697, 698, 699

[56] References Cited

U.S. PATENT DOCUMENTS

| | | | |
|---|---|---|---|
| 5,145,530 | 9/1992 | Cassady | 148/565 |
| 5,330,853 | 7/1994 | Hofmann et al. | 428/697 |
| 5,366,564 | 11/1994 | Yamagata et al. | 428/654 |

FOREIGN PATENT DOCUMENTS

| | | |
|---|---|---|
| 3731 127 C2 | 9/1988 | Germany . |
| 4331 890 A1 | 3/1995 | Germany . |
| 61-213350 | 9/1986 | Japan . |
| 6-256565 | 3/1987 | Japan . |

OTHER PUBLICATIONS patent Abstracts of Japan, Oct. 15, 1990, vol. 14/No. 470, 2-194159, Jul. 31, 1990.
patent Abstracts of Japan, Aug. 21, 1992, vol. 16/No. 394, 4-128362(A), Apr. 28, 1992.

*Primary Examiner*—David A. Simmons
*Assistant Examiner*—Linda L. Gray
*Attorney, Agent, or Firm*—Oblon, Spivak, McClelland, Maier & Neustadt, P.C.

[57] ABSTRACT

A coated member comprising a substrate, an intermediate layer on the substrate consisting essentially of aluminum and titanium, and a hard coating of (Al, Ti) (N, C) on the intermediate layer. The coated member has an improved wear resistance because the intermediate layer raises the level of adhesion between the substrate and the hard coating.

11 Claims, 6 Drawing Sheets

COATED MEMBER HAVING EXCELLENT HARDNESS AND, ADHESIVE PROPERTIES

FIELD OF THE INVENTION

The present invention relates to a coated member having excellent hardness and adhesive properties. In particular, it relates to a coated member having excellent hardness and adhesive properties which is suitable for use as a wear resistant member for which a high level of hardness is demanded such as cutting tools employed in milling, cutting, boring operation etc., moulds, bearings, dice, rollers etc.; or for use as a heat—corrosion resistant member such as the screw of an extruder, cylinders etc.

DESCRIPTION OF THE RELATED ART

The formation of a hard coating such as TiN, TiC etc. on the surface of a tool in order to improve the wear resistant properties of the tool is a technique commonly used for cutting tools for which a high wear resistance is demanded such as high speed steel tools, carbide tools etc.

Compared to TiC coatings, TiN coatings display improved oxidation resistance at high temperatures, and also display improved resistance to crater wear on the rake surface of the tool caused by frictional or working heat generated during cutting. TiN is also preferred for it's excellent adhesive properties. On the other hand, TiC is harder than TiN, and also displays better wear resistance to "flank wear" on the flank surface which contacts the workpiece. However, even TiN begins to oxidise at the relatively low temperature of 600° C., and TiC has a hardness no greater than 2000 kgf/mm$^2$, and thus there was a demand for a new coating of improved wear resistance.

In Japanese Patent Publication No. 2-194159, a new coating developed to meet these demands for a coating having improved hardness and oxidation resistance properties compared to TiN, TiC etc. is disclosed. This new coating is formed from a Ti, Al mixed nitride or Ti, Al mixed carbo-nitride [(Al,Ti)(N,C)], in which some of the titanium has been exchanged for aluminum. These coatings have an oxidation temperature of about 800° C. and a hardness of 2500 kgf/mm$^2$.

When forming the above-described (Al,Ti)(N,C) coating on a substrate, a cleaning technique performed within the coating furnace before deposition is employed in order to improve the adhesion of the coating to the substrate. For example, sputtering a gaseous Ar, H ions using glow discharge etc. or, bombardment of metal ions such as Ti or Al ions using vacuum are discharge are known as cleaning techniques.

However since the internal stress of (Al,Ti)(N,C) coatings is about twice that of TiN coatings, if one attempts to further improve the wear resistance properties by forming a thick coating, the internal stress increases and this internal stress tends to be the cause of crack generation and peeling of the coating. Accordingly, one has no choice but to use a coating of a thickness much thinner than that possible with the prior TiN coatings, and thus the improved properties of (Al,Ti)(N,C) coatings cannot be exploited sufficiently.

In Japanese Patent Publication No. Hei 4-128362, there is a disclosed a technique comprising forming a titanium metal layer of thickness less than 0.5 µm between the substrate and a mixed Ti, Al nitride, with the aim of improving the adhesion between the mixed nitride coating and the substrate. However, the level of adhesion is still deemed to be insufficient even when employing such a titanium intermediate layer, and there was a demand for the development of a hard coating of further improved wear resistance properties.

Several techniques are employed for forming hard coatings having heat resistance. Sputtering and ion-plating techniques performed using PVD for forming (Ti,Al)N, (Ti,Al)C, (Ti,Al)(C,N), (V,Ti)(N,C) coatings etc., are disclosed in Japanese Patent Publication No. Sho 62-56565. Japanese Patent Publication No. Hei 2-194159, Japanese Patent Publication Hei 4-221057, *Journal Vacuum Science Technology* (J. Vac. Sci. Technol.) A Vol. 4 (6) (1986) page 2717, and *Journal Solid State Chemistry* Vol. 70 (1987) pages 318–322.

The above-mentioned techniques employ crucible-type ion-plating methods, sputtering methods, and ion-plating methods effected by arc discharge using a cathode as the evaporation source. However the following problems exist with these methods.

(1) Crucible-Type Ion-Plating Method

The prior art ion-plating method involves the melting and vaporisation of the metal inside a crucible. Thus the position at which the vaporisation source may be set is limited and consequently the productivity is low in cases of coatings substrates having complicated shapes. Also, there often exists a desire to vaporize several different metals to form an alloy on the surface of the substrate. However, the vapor pressure difference between each of the different metals makes it difficult to stably control the composition of the alloy formed on the substrate.

(2) Sputtering Method

The level of adhesion between the coating and the substrate is not always very high with this method, and furthermore the coating efficiency in cases of coating substrates having complicated shapes is low. In addition, when using AlTi, AlTiNC etc., as the target, the sputter rate tends to vary over time, and it is necessary to adjust the composition of the target in accordance with the anticipated change while sputtering. Also, the ionization rate of the sputter particles is low, and thus the amount of ions implanted into the substrate is low. As a result, it is difficult to obtain a sufficient level of adhesion, and the coating rate is slow making it an unsuitable technique for mass production.

(3) Arc Discharge Type Ion Plating Method

Figure 1:
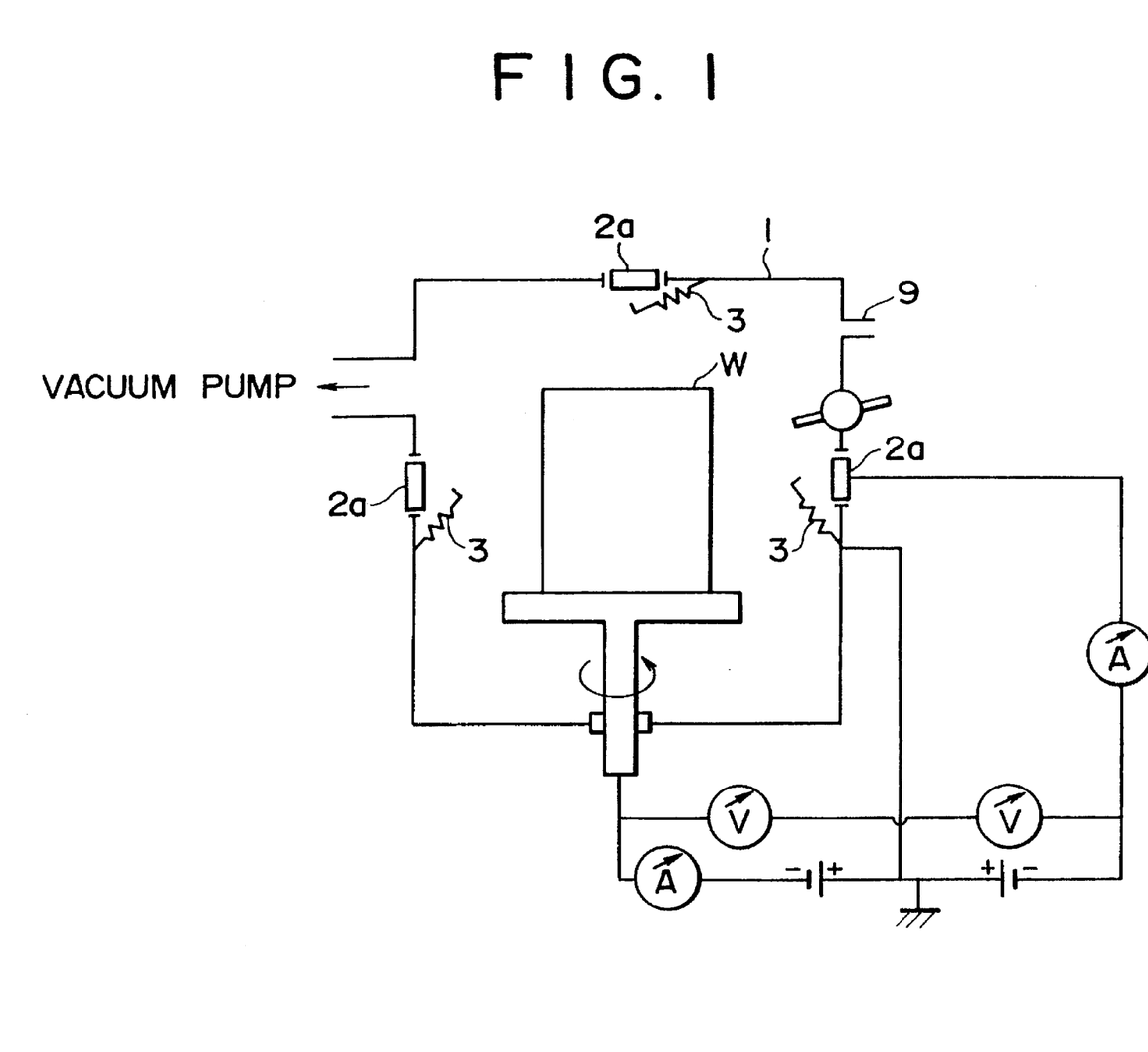
FIG. 1 is a generalised diagram of a typical arc discharge ion-plating apparatus.

This method involves the use of the kind of apparatus shown in FIG. 1. The reactive gas is fed into the chamber through port 9, and an arc is discharged between a vaporization source cathode and a trigger anode 3 to form a coating on the surface of the substrate W to which a negative bias is applied. With this arc discharge method, a sputter cleaning technique, involving metal ion bombardment, is performed before forming the coating in order to remove impurities from the surface of the substrate with the aim of improving the level of adhesion between the coating and the substrate. With this method, it is possible to achieve a good cleaning effect, and thus a sufficient degree of adhesion of the coating on the substrate is possible. Also, when using this method to form (Al,Ti)N coatings, one possible method is to use two separate cathodes formed of Ti and Al respectively. However, if a single alloy cathode formed of the target composition TiAl is used, the control of the composition of the coating is rendered much easier.

Also, in such cases of mixed metal alloy vaporisation, the fact that a large electric current of several tens of amperes or greater is used, means that there is very little variation in the composition of the cathode material. Also, because the ionisation rate is high, the reactivity is high and consequently it is easy to obtain a coating of excellent adhesion by applying a negative bias voltage to the substrate.

However, there exists a problem with this method in that large macro-particles of a size 1–5 μm are adsorbed on the surface of the coating formed on the substrate, due to the fact that a direct discharge from the solid cathode is employed. As a result, not only is the coating poor in terms of surface roughness and polish, there is also the problem, in the case that the coated member is used as cutting tool etc., that under certain conditions the work material becomes adhered to the cutting tool, with a consequent decrease in the degree of cutting precision and reduction of the wear resistant properties of the cutting tool itself.

Accordingly, there is a demand for the development of a coated member which (a) is improved in terms of surface roughness and polish, (b) has excellent wear resistance properties, (c) there is no occurrence of adhesion of work material thereon when used as a cutting tool, and (d) can be produced industrially with a high productivity.

SUMMARY OF THE INVENTION

This invention was made in light of the above-described problems in the prior art, and has as its objective the provision of a coated member in which the wear resistance is improved by raising the level of adhesion between the substrate and the coating, whilst continuing to exploit the excellent oxidation resistance and hardness properties of (Al,Ti)(N,C).

Another objective of the present invention is to provide a coated member which (a) is improved in terms of surface roughness and polish, (b) has excellent wear resistance properties, (c) improved in terms of resistance to adhesion of work material thereto when used as a cutting tool, and (d) can be produced industrially with a high productivity.

The coated member according to the present invention comprises a substrate having an intermediate metallic layer of the following composition;

$Al_zTi_{1-z}$, where $0.05 \leq z \leq 0.75$ and of thickness in the range of 5–500 nm formed on the surface thereof; and having a coating of the following composition;

$(Al_xTi_{1-x})(N_yC_{1-y})$, where $0.56 \leq x \leq 0.75$, and $0.6 \leq y \leq 1$ formed on the surface of the metallic intermediate layer. Preferably, the metallic intermediate layer has the following composition:

$Al_zTi_{1-z}$, where $0.25 \leq z \leq 0.70$ and has a thickness in the range of 30–300 nm. Furthermore, the coating preferably has the following composition;

$(Al_xTi_{1-x})(N_yC_{1-y})$, where $0.58 \leq x \leq 0.70$, and $0.8 \leq y \leq 1$ and has a thickness in the range of 0.1–20 μm. In the case that the coated member is to be used as a tool which is operated under severe conditions, such as a roughing endmill, then if a high speed steel including V and Co in amounts satisfying the following equation;

0<(percentage weight of V+percentage weight of Co)<15, is adopted as the substrate, then it is possible to obtain a wear resistant tool which not only has further enhanced adhesion between the coating and the substrate, but which is also improved in terms of resistance to chipping, working life, and cutting performance.

Furthermore, the metallic intermediate layer and hard coating satisfying the above-described parameters can both be formed using an arc discharge ion plating technique. If after formation of the hard coating, the marco-particles deposited on the surface of the coating are removed by polishing (leaving behind craters in the surface of a depth in the range 0.2–2 μm), to produce a surface which is free of macro-particles protruding from the surface to any substantial extent, it is possible to obtain a wear resistant coated member which is further enhanced in terms of resistance to adhesion of work material thereto.

DETAILED DESCRIPTION OF THE INVENTION

The reason that the hard coating applied to the surface of the member of this invention displays improved adhesiveness to the subtrate compared to the prior art coatings is thought to be because the metallic intermediate layer formed between the substrate and the coating, (a) reduces the stress generated at the boundary between the substrate and the coating, and (b) enhances the adhesion by effecting inter diffusion between the substrate and the coating.

As will be clear from the hereafter described embodiments, the AlTi metallic intermediate layer serves to increase the degree of adhesion to a new level compared to the prior art titanium metallic intermediate layer. The reason for this step-up in adhesion is thought to be as follows; as well as serving as the foundation for the subsequent (Al,Ti) (C,N) hard coating, the AlTi metallic intermediate layer, which has higher affinity with the hard coating than the titanium metallic intermediate layer, causes inter diffusion after the hard coating has been formed, to thereby generate carbides and nitrides which are rather denser and the have improved adhesive properties.

It is also possible to effect gaseous ion sputter cleaning or metal ion bombardment cleaning before forming the AlTi metallic intermediate layer, to thereby enhance the cleanliness of the surface and hence further enhance the degree of adhesion.

Even in those cases when sputter cleaning or metal ion bombardment cleaning has not been performed at all or has not been performed sufficiently, the aluminum and titanium making up the intermediate layer react with any carbon or oxygen or other unwanted dirt remaining on the surface far move vigorously than would a carbide or nitride, and can dissolve small amounts of these elements thereby enhancing the level of adhesion. Accordingly, it is also possible according to this invention to include small amounts of C and O in the AlTi intermediate layer.

It is essential that the AlTi metallic intermediate layer have the following composition;

$$Al_zTi_{1-z}, \text{ where } 0.05 \leq x \leq 0.75$$

If the value of z is less than 0.05, the amount of aluminum is too small to achieve a sufficient degree of adhesion with the (Al,Ti)(C,N) coating having composition given by $(Al_xTi_{1-x})(N_yC_{1-y})$, where $0.56 \leq x \leq 0.75$, and $0.6 \leq y \leq 1$. On the other hand if the value of a z exceeds 0.75, a $(Al_xTi_{1-x})(N_yC_{1-y})$ composition in which x exceeds 0.75 will be generated at the interface between the intermediate layer and the coating. Provided x is less than or equal to 0.75, the $(Al_xTi_{1-x})(N_yC_{1-y})$ composition has a cubic crystalline structure, but if x exceeds 0.75 the $(Al_xTi_{1-x})(N_yC_{1-y})$ composition adopts a hexagonal crystalline structure. If z exceeds 0.75, a carbide-nitride having a different crystalline structure is formed at the interface, and as a result the adhesive forces are reduced, and it is impossible to obtain a sufficient level of wear resistance due to the presence of the hexagonal crystals which have low hardness. It is preferable that z be in the range $0.25 \leq z \leq 0.70$, and more preferably in the range $0.50 \leq z \leq 0.65$.

Furthermore, it is essential that the thickness of the AlTi intermediate layer be kept in the range 5–500 nm. If the thickness is less than 5 nm, the effect of the intermediate layer is not sufficiently realised, and if the thickness is greater than 500 nm, cracks occur in the intermediate layer as a result of impact forces, and peeling of the coating tends to occur. It is preferable that the lower limit of the thickness of the intermediate layer be 30 nm, and more preferably 60 nm. It is preferable that the upper limit of the thickness of the intermediate layer be 300 nm, and more preferably 150 nm.

With respect to the metal components of the hard coating $(Al_xTi_{1-x})(N_yC_{1-y})$, it is essential that x have a value satisfying the following equation; $0.56 \leq x \leq 0.75$. If x is less than 0.56, the effect of improved oxidation resistance can not be realised. If x is greater than 0.75, then the crystal structure changes from a cubic structure to a hexagonal structure, and the hardness of the coating is reduced with a consequent reduction in the wear resistance. It is preferable that the lower limit of the value of x be 0.58 and more preferably be 0.59. With respect to the upper limit of x, it is preferable that x be less than 0.70, and more preferably be less than 0.65.

According to this invention, it is possible to obtain a coating displaying excellent wear resistance properties whether the hard coating be a mixed metal nitride, or a mixed metal carbide-nitride. However, in the case of a carbide-nitride, it is essential that the nitrogen be present in an atomic ratio of 60% of more. In other words, if the composition of the non-metallic components of the carbide-nitride coating composition be expressed by $(N_yC_{1-y})$, it is essential that $0.6 \leq y \leq 1$. if y is less than 0.6, the oxidation resistance properties of the coating are reduced. A composition in which y is greater than 0.8 displays markedly enhanced oxidation resistance properties.

The thickness of the coating is preferably in the range of 0.1 to 20 μm. If the thickness is less than 0.1 μm, the wear resistance of the coating is not sufficient; and if the thickness exceeds 20 μm, undesirable cracks sometimes appear in the coating caused by impact forces. In the case that this invention is applied to a cutting tool, then in order to obtain a coated tool having excellent wear resistance, whilst exploiting the inherent cutting properties of the substrate tool, it is preferable that the thickness be equal to or greater than 1 μm, and more preferably equal to or greater than 2 μm. With respect to the upper limit of the thickness, it is preferable that the thickness be equal to or less than 12 μm, and more preferably equal to or less than 8 μm.

The material to be used as the substrate in this invention is not limited, and it is possible to use any of those materials commonly used in the manufacture of cutting tools, moulds etc., such as high speed steels or carbides etc.

However, in the case that this invention is applied to a cutting tool which is used under severe conditions, such as a roughing end mill, then in order to (i) enhance the resistance of the tool to chipping, (ii) contain damage to the tool, and (iii) improve the adhesion between the substrate surface and the coating to realise excellent wear resistance properties, it is preferable to select as the substrate a high speed steel which includes vanadium and cobalt in amounts satisfying the following equation (1);

$$0<(\text{percentage weight of V}+\text{percentage weight of Co})<15 \quad (1)$$

and which preferably has a hardness equal to or greater the HV900.

In the case that the coated member of this invention is used as a cutting tool operated under severe conditions, such as a roughing end mill, then the life of the tool is not only affected by the degree of wear of the hard coating applied to the cutting edge, but is also greatly affected by chipping generated at the cutting edge. In other words, if the tool substrate situated beneath the coating is easily damaged, then the excellent wear resistance properties of the coating cannot be exploited.

However, if as described earlier, a high speed steel having a hardness greater than HV 900 and including amounts of Co and V satisfying the above equation (1), then the resistance to chipping is enhanced, and by applying to such a substrate an intermediate metallic intermediate layer having a composition given by $Al_zTi_{1-z}$, where $0.05 \leq z \leq 0.75$ and having a thickness in the range of 5–500 nm followed by a coating having a composition given by $(Al_xTi_{1-x})(N_yC_{1-y})$, then it is possible to obtain a tool not only having a hard coating of superior wear resistance, but also having enhanced performance in terms of cutting efficiency and working life.

If the total amount of included V and Co exceeds 15% percentage weight of the total amount of steel, then as will become clear from the embodiments described later, the cutting edge or point is prone to chipping, and the working life of the tool when used under severe cutting conditions becomes unpredictable. On the other hand, since the inclusion of V and Co has the effect of enhancing the heat resistance characteristics of the parent substrate as well as increasing the hardness and wear resistance of the high speed steel, then there is the concern that any reduction in the amounts of these elements V and Co will have a bad effect on the life of the tool. Having said this, since a remarkable wear resistance enhancing effect is achieved by the formation on the substrate of an intermediate metallic layer followed by the hard coating in accordance with this invention, then even if the amounts of Co and V are reduced, provided they are included to the extent that the hardness of the high speed steel is equal to or greater than 900HV, then it is possible to obtain a cutting tool having a sufficiently long working life and displaying sufficient anti-wear characteristics.

The kind of high speed steel which is preferred for use as the substrate to produce a rough machining end mill, can be manufactured by the usual smelting methods. However, by employing powder metallurgy, a high speed steel in which the included carbide particles are of a small size can be obtained, which is preferable in that an enhanced resistance to chipping can be realised.

A PVD method typified by ion plating methods, sputtering methods etc. can be used to form the hard coating of this invention. In the case that an arc discharge ion-plating method is employed, if is preferred that the following method be used. First, an intermediate metallic layer is formed by the ion-plating in a vacuum of the metal components Ti, Al ionised by arc discharge from a cathode adopted as the vaporisation source. Then, by employing an ion-plating technique in an atmosphere of nitrogen gas and/or methane gas, and adopting a target having the same metal composition as that desired for the hard coating, an intermediate layer and hard coating of a consistent composition can be obtained. If a bias voltage is applied to the substrate, the adhesion of the coating to the substrate can be further enhanced. Also, it is preferred that the pressure of the gas used in the ion-plating technique be in the range of $1 \times 10^{-3}$ to $5 \times 10^{-2}$ Torr, in order to make it easier to obtain a dense and highly crystalline hard coating having excellent wear resistance.

Generally any method can be used to form the intermediate metallic layer, such as a vacuum vapor deposition technique or a sputtering technique. However it is particularly preferred that an arc discharge ion-plating methods of the same type described above as a preferred method for the formation of the hard coating be used.

Figure 2A:
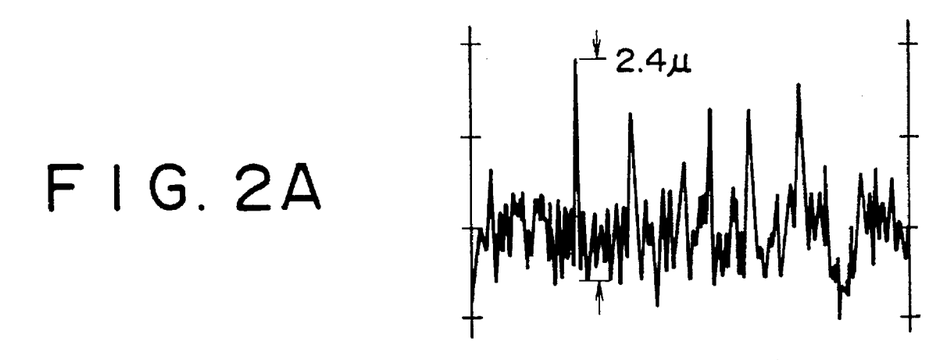
FIGS. 2(A) and 2(B) are diagrams showing the degree of surface roughness of a coated member according to an embodiment of the present invention.

The hard coating formed by using the above-described arc discharge ion-plating technique exhibits excellent wear resistance. However, as for example shown in FIG. 2(A) and FIG. 3(A), macro-particles of a diameter in the range of 1–5 μm protrude from the surface of the coating in large numbers, and there is the concern that during cutting or grinding operations, these particles will cause some of the work piece material to adhere to the tool consequently reducing the precision of the cutting/grinding operation.

Figure 2B:
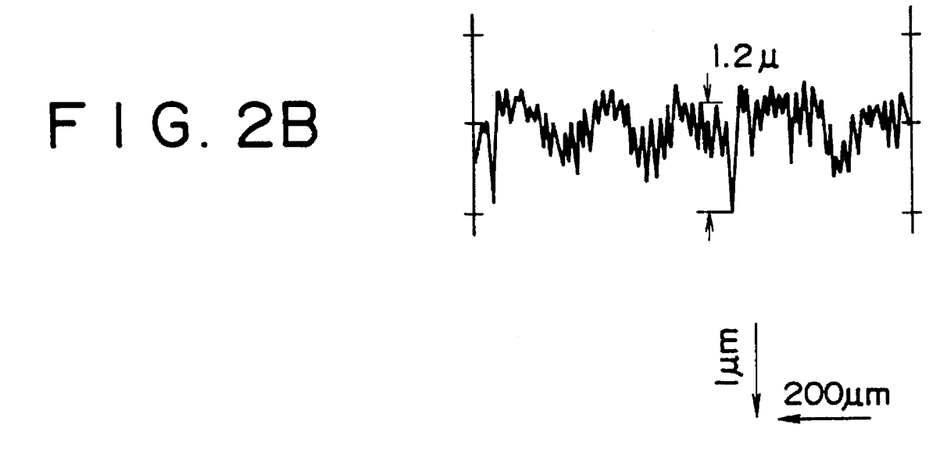

According, in order to solve this problem, it is preferred that these macro-particles be removed from the surface by polishing to thereby smoothen the surface. This removal of the macro-particles leaves behind shallow craters having a depth in the range 0.2 to 2 μm (see FIG. 2(B) and FIG. 3(B)), but these craters do not cause any of the work piece material to adhere to the tool, and it possible to significantly enhance the performance of the tool in terms of the amount of material adhering to the surface of the tool during the work operation. In other words, the coated member for which the macro-particles have been removed by this method, can be characterised in that craters having a depth in the range of 0.2–2 μm are present in large numbers on the surface of the coating, and a coated member having such a coating surface, is not only hard but also exhibits excellent properties in terms of wear resistance and resistance to work material adhering to the tool surface.

There is no restriction on the type of method used to remove the macro-particles; however it is preferred that techniques such as barrel finishing, said bluster using glass beads etc., lapping, polishing etc. be used, since with these techniques, the grinding action acts locally on the macro-particles protruding from the surface, with hardly any wear of the coating itself, making it possible to thereby remove only the macro-particles.

In addition, the coating after removal of the macro-particles can have any thickness, but if it is made to be too thin then the degree of wear resistance tends to be somewhat lacking, and if it is made too thick then there is the tendency for cracks to appear in the coating as a result of impact forces. Thus, a standard thickness is in the range 0.1–20 μm, and it is preferred that the coating have a thickness in the range 1–12 μm, and more preferably in the range 2–8 μm.

When the coated member according to this invention is used as, for example, a solid type gear hob etc., the hard coating on the rake surface is removed during grinding of the rake surface in order to sharpen the cutting edge. However, if the macro-particle removing process is performed for only a short time such as 5–10 minutes, it is possible to maintain the cutting edge portion of the bob in a sharp condition (radius less or equal to 10 μm), and thus there is no need to perform the regrinding used in the prior art methods. As a result, it is possible to use the gear hob with the coating remaining on the rake surface, thus enhancing the wear resistance of the cutting portion.

Next, examples of the present invention will be described. The following examples are given to aid in understanding the invention and it is to be understood that the invention is not limited to the particular materials, procedures, or conditions given in the examples.

EXAMPLE 1

A high speed steel (Vickers Hardness 850) having the following dimensions; length 25 mm, width 25 mm, thickness 10 mm, and corresponding to JIS standard SHK 51 is subjected to surface polishing and is employed as a substrate. This substrate is mounted in an arc discharge ion-plating apparatus and heated to 400° C. The chamber of the apparatus is evacuated, and then titanium is vaporized from a titanium cathode, whilst applying a bias voltage of −1500V to the substrate, to thereby clean the surface of the substrate by titanium ion bombardment. Next, an intermediate layer is formed on the substrate by employing a cathode of a composition corresponding to the desired intermediate layer composition (as shown in Table 1), and applying a bias voltage of between −300V and −1000V to the substrate. The thickness of the intermediate layer formed in each case is also shown in Table 1 below. Next the hard coating is formed on the intermediate layer (or substrate in case of prior art example No.2). A cathode of composition corresponding to the metal composition of the desired hard coating composition is employed. A reactive gas comprising nitrogen gas and/or methane gas is fed into the chamber to a pressure of $7 \times 10^{-3}$ Torr, and a bias voltage of −300V is applied to the substrate to produce a finished test piece having a hard coating of thickness 5 μm and composition as detailed in Table 1.

Figure 4:
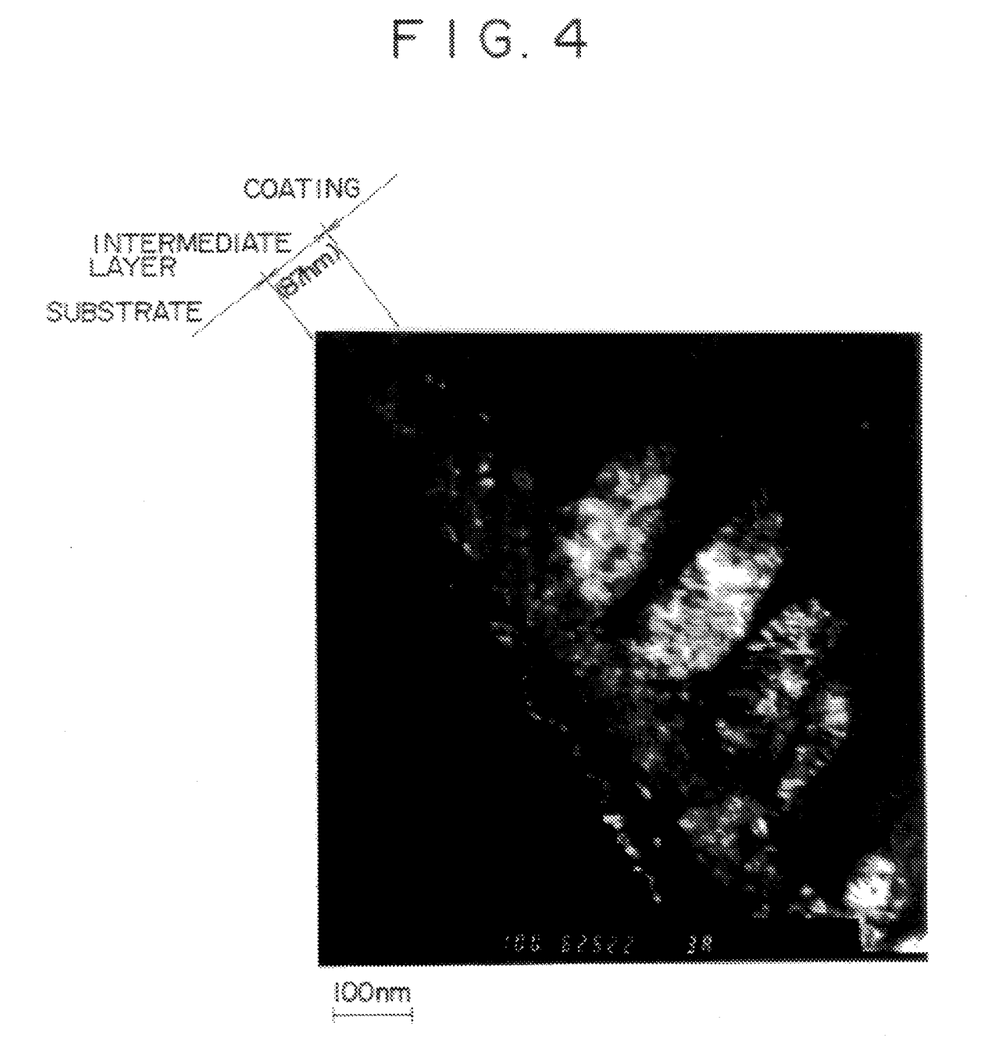
FIG. 4 is cross-sectional image taken with a transmission electron microscopic of the metallic intermediate layer of a coated member according to an embodiment of the present invention.

The composition of the coating of each test piece was determined by electron probe X-ray microanalysis and Auger electron spectroscopy. The thickness of the intermediate metallic layer was determined using cross-sectional images of the kind shown in FIG. 4 obtained using a transmission electron microscope, and by using a high resolution scanning electron microscope. The composition of the intermediate metallic layer was determined by energy dispersive X-ray analysis within the transmission electron microscope, and by Auger electron spectroscopic analysis of a test piece on which only the intermediate layer had been formed. When the crystal structure of the coatings obtained according to this embodiment was analyzed by X-ray diffraction, all the coatings had X-ray diffraction patterns the same as that of TiN indicating a cubic structure.

The test pieces were then subjected to a scratch test under the following conditions:

| | |
|---|---|
| Indenter | Cone-type diamond (tip diameter: 0.2 mm) |
| Rate of Increase of Force: | 100 N/min |
| Scratch Speed: | 10 mm/min |

The results of the scratch test for each test piece are shown in Table 1 below.

The coated endmills thus obtained were subjected to a cutting test under the following conditions;

| | |
|---|---|
| Cutting method: | Down Cut |
| Object Material: | S50C (Hardness HB 217) |
| Depth of Cut: | Rd 1mm × Ad 10 mm |
| Cutting Speed: | 97 m/min |
| Feed: | 0.063 mm/tooth (390 mm/min) |
| Lubricant: | Air Blow |
| Cutting Length: | 50 m |

The results of the cutting test are shown in Table 2.

| TEST PIECE NO. | INTERMEDIATE LAYER COMPOSITION | INTERMEDIATE LAYER THICKNESS (nm) | COATING COMPOSITION | SRATCH TEST CRITICAL LOAD (N) | |
|---|---|---|---|---|---|
| 1 | Ti | 110 | $(Al_{0.6}Ti_{0.4})N$ | 32.5 | Prior Art Example |
| 2 | | 0 | $(Al_{0.6}Ti_{0.4})N$ | 5.1 | Prior Art Example |
| 3 | $A_{0.03}Ti_{0.97}$ | 90 | $(Al_{0.7}Ti_{0.3})N$ | 43.0 | Comparative Example |
| 4 | $Al_{0.06}Ti_{0.4}$ | 3 | $(Al_{0.6}Ti_{0.4})N$ | 32.7 | Comparative Example |
| 5 | $Al_{0.6}Ti_{0.4}$ | 530 | $(Al_{0.6}Ti_{0.4})N$ | 28.3 | Comparative Example |
| 6 | $Al_{0.6}Ti_{0.4}$ | 35 | $(Al_{0.6}Ti_{0.4})N$ | 80.2 | Invention Embodiment |
| 7 | $Al_{0.6}Ti_{0.4}$ | 87 | $(Al_{0.6}Ti_{0.4})(N_{0.8}C_{0.2})$ | 82.4 | Invention Embodiment |
| 8 | $Al_{0.7}Ti_{0.3}$ | 120 | $(Al_{0.7}Ti_{0.3})N$ | 86.7 | Invention Embodiment |
| 9 | $Al_{0.25}Ti_{0.75}$ | 105 | $(Al_{0.6}Ti_{0.4})(N_{0.8}C_{0.2})$ | 81.5 | Invention Embodiment |
| 10 | $Al_{0.6}Ti_{0.4}$ | 450 | $(Al_{0.6}Ti_{0.4})N$ | 72.8 | Invention Embodiment |
| 11 | $Al_{0.6}Ti_{0.4}$ | 135 | $(Al_{0.6}Ti_{0.4})N$ | 38.9 | Comparative Example |

As is clear from Table 1, both the prior art test pieces No. 1 and 2 are poor in terms of adhesion. No. 3 which is a comparative example in which the aluminum content of the intermediate metallic layer is too small, No. 4 which is a comparative example in which the thickness of the intermediate metallic layer is too thin, No. 5 which is a comparative example in which the thickness of the intermediate metallic layer is too thick, and No. 11 which is a comparative example in which the aluminum content of the intermediate metallic layer is too great, are also poor in terms of adhesion.

In contrast, the test pieces No. 6 to No. 10 for which the intermediate metallic layer and hard coating fulfill the requirements of the this invention, all exhibit a scratch critical load of greater than 70N, indicating excellent adhesion.

TABLE 2

| TEST PIECE NO. | INTERMEDIATE LAYER COMPOSITION | INTERMEDIATE LAYER THICKNESS (nm) | COATING COMPOSITION | DEGREE OF FLANK WEAR (mm) | |
|---|---|---|---|---|---|
| 1 | Ti | 130 | $(Al_{0.6}Ti_{0.4})N$ | 0.115 | COMPARATIVE EX. |
| 2 | — | 0 | $(Al_{0.6}Ti_{0.4})N$ | 0.226 | COMPARATIVE EX. |
| 3 | $Al_{0.6}Ti_{0.4}$ | 120 | $(Al_{0.6}Ti_{0.4})N$ | 0.038 | INVENTION EMBOD. |
| 4 | $Al_{0.6}Ti_{0.4}$ | 230 | $(Al_{0.6}Ti_{0.4})(N_{0.8}C_{0.2})$ | 0.036 | INVENTION EMBOD. |
| 5 | $Al_{0.6}Ti_{0.4}$ | 530 | $(Al_{0.6}Ti_{0.4})N$ | 0.098 | COMPARATIVE EX. |

As is clear from Table 2, the coated endmill according to this invention (No. 3, No. 4) shows very little wear on the flank, indicating their excellent resistance to Flank wear when compared to the comparative prior art examples (No. 1 and No. 2). Comparative example No. 5 in which the thickness of the intermediate metallic layer is too great, shows a large degree of wear on the flank surface, indicating insufficient wear resistance.

EXAMPLE 2

A twin-blade endmill of external diameter 10 mm, is manufactured from a WC-Co carbide substrate. As in Example 1, the carbide substrate has an intermediate metallic layer of composition and thickness shown in Table 2, followed by a hard coating of composition shown in Table 2 and thickness of 3 μm, formed thereon.

EXAMPLE 3

A high speed tool steel (JIS Standard SKH55) is adopted as a substrate to manufacture a normal module 2.5, PA20° solid type gear hob of external diameter 80 mm and length 80 mm. The same method employed in Example 1 is used to form on the substrate intermediate metallic layers and hard coatings as detailed in Table 3.

TABLE 3

| TEST PIECE NO. | INTERMEDIATE LAYER COMPOSITION | INTERMEDIATE LAYER THICKNESS (nm) | COATING COMPOSITION | |
|---|---|---|---|---|
| 1 | Ti | 130 | $(Al_{0.6}Ti_{0.4})N$ | COMPARATIVE EX. |
| 2 | — | 0 | $(Al_{0.6}Ti_{0.4})N$ | COMPARATIVE EX. |
| 3 | $Al_{0.6}Ti_{0.4}$ | 120 | $(Al_{0.6}Ti_{0.4})N$ | INVENTION EMBODIMENT |

Figure 5:
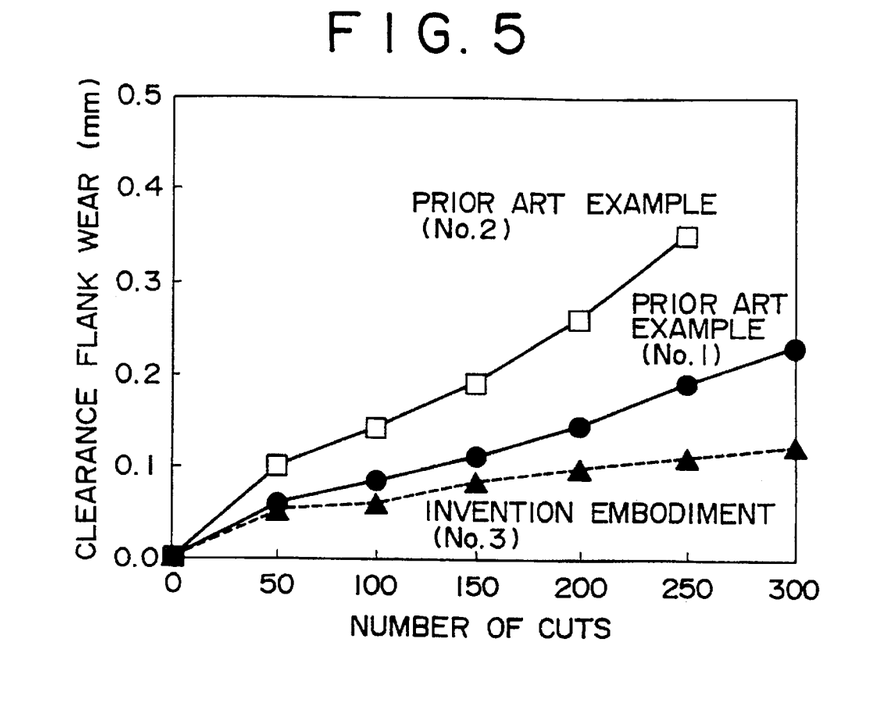
FIG. 5 is a graph showing the relationship between the degree of flank wear and the number of times of use of a coated tool according to an embodiment of the present invention.

The surface-coated solid hobs thus obtained, are subject to grinding of the rake surface, and thereafter used to perform the cutting of gears under the conditions detailed below. The resultant changes in the degree of wear on the flank surface are shown in FIG. 5.

Work Material: SCR440 (Hardness HB 140–160), Normal Module 2.5, Normal Pressure Angle 20°, Number of Teeth 31
Helix angle: 30° 34' Right Hand, Width 25 mm Cutting Conditions:

| | |
|---|---|
| Cutting Method: | Down Cut |
| Work Material: | S50C (Hardness HB259) |
| Depth of Cut: | 10 mm (Rd: radial direction) × 25 mm (Ad: axial direction) |
| Cutting speed: | 17.6 m/min |
| Feed: | 0.286 mm/tooth (80 mm/min) |
| Lubricant: | Water Soluble Emulsion |
| Cutting Length: | 5 m |

TABLE 4

| TEST PIECE NO. | (V + Co) % wt. | INTERMEDIATE LAYER COMPOSITION | INTERMEDIATE LAYER THICKNESS (nm) | COATING COMPOSITION | DEGREE OF CUTTING EDGE DAMAGE (mm) | |
|---|---|---|---|---|---|---|
| 1 | 14.0 | Ti | 100 | $(Al_{0.6}Ti_{0.4})N_{0.8}C_{0.2})$ | 2.3 | PRIOR ART EX. |
| 2 | 14.0 | — | 0 | $(Al_{0.6}Ti_{0.4})N_{0.8}C_{0.2})$ | 2m STOP | PRIOR ART EX. |
| 3 | 14.0 | $Al_{0.6}Ti_{0.4}$ | 120 | $(Al_{0.6}Ti_{0.4})N_{0.8}C_{0.2})$ | 0.18 | INVENTION EX. |
| 4 | 14.0 | $Al_{0.6}Ti_{0.4}$ | 520 | $(Al_{0.6}Ti_{0.4})N_{0.8}C_{0.2})$ | 1.1 | COMP. EX. |
| 5 | 16.5 | Ti1 | 100 | $(Al_{0.6}Ti_{0.4})N$ | 2.7 | PRIOR ART EX. |
| 6 | 16.5 | $Al_{0.6}Ti_{0.4}$ | 140 | $(Al_{0.6}Ti_{0.4})N$ | 0.33 | INVENTION EX. |
| 7 | 16.5 | $Al_{0.6}Ti_{0.4}$ | 550 | $(Al_{0.6}Ti_{0.4})N$ | 1.6 | COMP. EX. |

-continued

| | |
|---|---|
| Cutting Speed: | 100 m/min |
| Feed: | 3.1 mm/rev |
| Hob Shift: | None |

As is clear from FIG. 5, the Solid Hob (No. 5) according to this invention, displays improved wear resistance compared to the comparative prior art examples No. 1 and No. 2.

EXAMPLE 4

Figure 6:
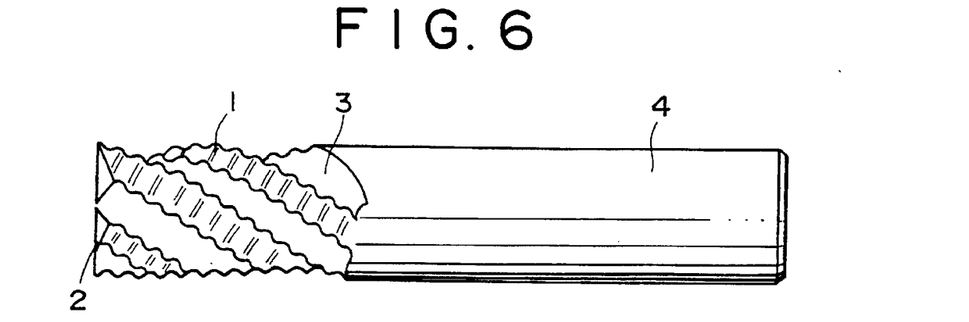
FIG. 6 shows a general view of the shape of a roughing end mill.
Figure 7:
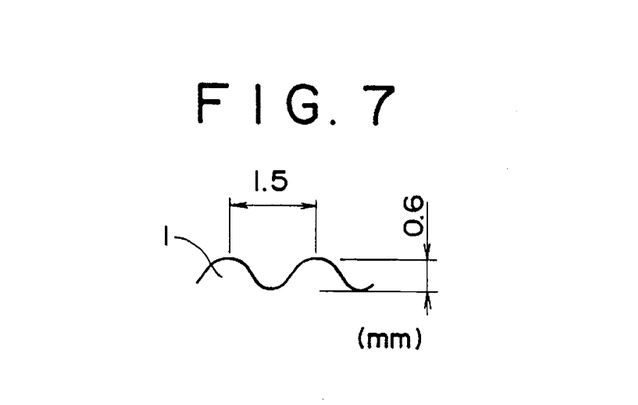
FIG. 7 shows the wave-like shape of the corrugated cutting edge of a roughing end mill.

FIG. 6 is a generalized view of the typical shape of a roughing endmill. 1 denotes the corrugated cutting edge, 2 denotes the end cutting edge, 3 denotes the flute, and 4 shows the shank. A roughing endmill having the following dimensions; diameter 20 mm, blade length 38 mm, total length 145 mm, shank diameter 20 mm was manufactured from a high speed steel substrate in which V and Co were included to controlled amounts, and intermediate metallic layers and hard coatings as detailed in Table 4 below were formed on the cutting edge of the substrate. The thickness of the carbide-nitride coating is 3 µm. The wave shape of the corrugated cutting edge is shown in FIG. 7.

The roughing endmills thus obtained were subjected to a cutting test under the conditions detailed below. The resultant damage to the cutting edge of the end mill bit was measured and the results are shown in Table 4.

As is clear from Table 4, in the case of the comparative prior art examples (No. 1, 2, 5), the damage resulting from cutting is large, and it is not possible to meet the objective of this invention. In contrast, in the cases of Examples No. 3 and No. 6 according to this invention, the degree of damage is small indicating excellent wear resistance properties. This is because the adhesion of the hard coating of comprising (carbide) nitrides is enhanced for the examples according to this invention, and thus peeling and consequent chipping of the cutting edge during the cutting operation do not occur, and excellent wear resistance properties are exhibited. In particular, in the case of Example No. 3, in which the total amount of included V and Co in the high speed steel substrate is less than 15% wt, the damage to the substrate itself is minor, and further improved wear resistance properties are exhibited.

In the case of Examples No. 4 and No. 7 in which the thickness of the intermediate layer is too great, the adhesion between the substrate and hard coating is poor, resulting in poor wear resistance properties.

Figure 8:
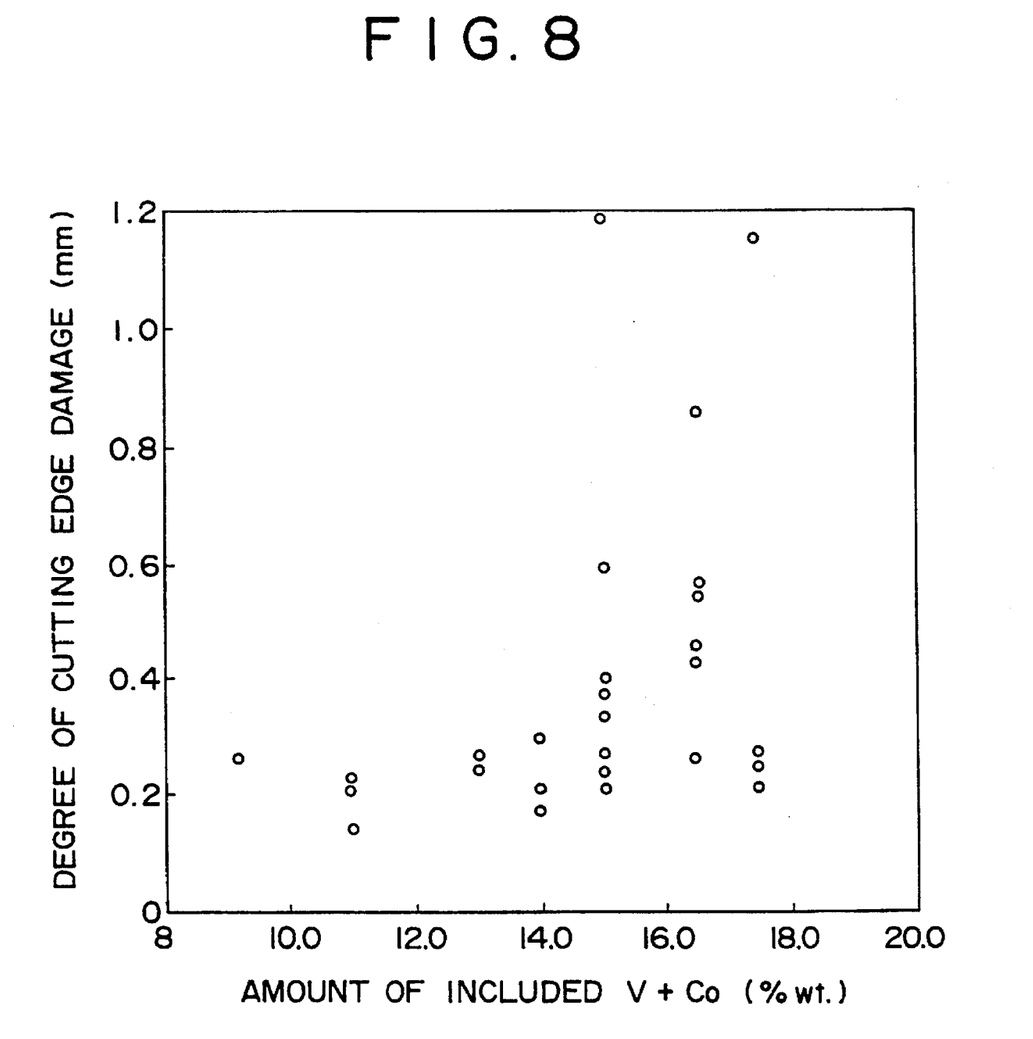
FIG. 8 is a graph showing the relationship between the degree of damage to the cutting edge and the percentage weight of included V and Co, for a high speed steel tool according to an embodiment of the present invention.

FIG. 8 shows the relationship between the amount of included V and Co, and the degree of cutting edge damage derived from a large series of experiments involving a roughing endmill made from a high speed steel substrate in which the amount of Co and V included therein are varied, and on the surface of which a (Al,Ti) intermediate layer followed by a (Al,Ti)(C,N) hard coating is formed. As is clear from the graph, in the case of the endmills so which the present invention was applied, it is possible to effectively contain the degree of cutting edge damage by restricting the total amount of included Co and V to less than or equal to 15%.

EXAMPLE 5

A solid hob having the same shape as the hob of Example 3 is made employing a high speed steel (JIS Standard SKH55) as the substrate. As in Example 3, intermediate metallic layers and hard coatings as detailed in Table 5 are formed on the surface of the substrate, and the surface of the resulting coated hob is subject to barrel finishing for ten minutes using a 2 mm diameter alumina barrel chip and #800WA grinding material.

Figure 3A:
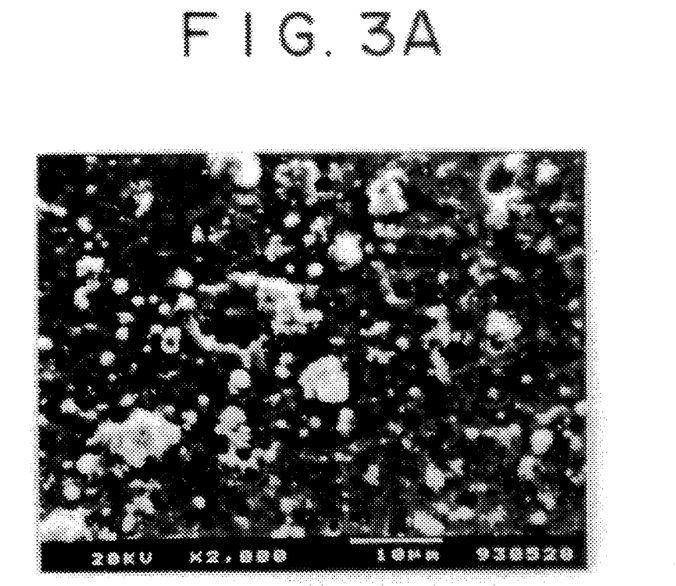
FIG. 3(A) and 3(B) are microscopic photographs of the surface structure of a coated member according to an embodiment of the present invention.
Figure 3B:
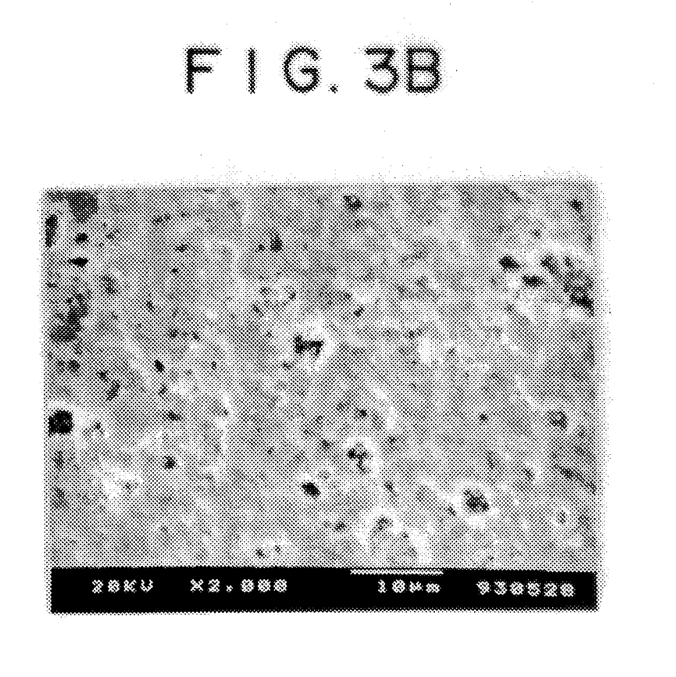

The roughness of the flank surface of the coated hob before grinding is as shown in the microscopic photographs shown in FIG. 3(A). In each case, a large number of rough macro-particles are shown to be protruding from the surface, some of these macro-particles protruding as much as 2.4 μm from the surface. In contrast, the coated hob after the barrel finishing has a surface, as shown in FIG. 3(B), from which almost all of the macro-particles have been removed to leave almost no protrusions from the surface. Craters of a depth in the range of 0.2-2 μm are left behind on the surface in the locations where the macro-particles had existed.

Furthermore, there is very little variations in the thickness of the coating before and after the barrel finishing, the thickness remaining approximately the same at about 5 μm. Hence, it is confirmed that the barrel finishing process only acts to remove the macro-particles.

The rake surface of each of the thus obtained coated solid type hob is subjected to cutting edge grinding, and thereafter used to perform the cutting of gears under the same conditions as detailed in Example 3. The degree of wear on the flank surface of the solid hob, and the presence of any work material adhered to the cutting edge, were investigated after the completion of the cutting of 200 gears, and the results are shown in Table 5.

material to the surface, and enhanced wear resistance properties were exhibited.

In the case of comparative examples No. 4 and No. 7 in which the thickness of the intermediate layer was too great, the wear resistance properties and the degree of adhesion between the substrate and the coating were insufficient.

What is claimed is:

1. A coated member comprising:

a substrate;

a metallic intermediate layer formed on said substrate having a thickness in the range of 5-500 nm and having a composition given by the following expression, $Al_zTi_{1-z}$, where $0.05 \leq z \leq 0.75$;

and a hard coating formed on said metallic intermediate layer having a composition given by the following expression, $(Al_xTi_{1-x})(N_yC_{1-y})$, where $0.56 \leq x \leq 0.75$, and $0.6 \leq y \leq 1$, wherein said metallic intermediate layer consists essentially of Al and Ti.

2. The coated member according to claim 1 wherein said intermediate layer has a thickness in the range 30-300 nm and has a composition given by the following expression, $Al_zTi_{1-z}$, where $0.25 \leq z \leq 0.70$;

and said hard coating has a thickness in the range of 0.1-20 μm and has a composition given by the following expression, $(Al_xTi_{1-x})(N_yC_{1-y})$, where $0.58 \leq x \leq 0.70$, and $0.8 \leq y \leq 1$.

3. The coated member according to claim 1 or 2 wherein said coated member is a cutting tool.

TABLE 5

| TEST PIECE NO. | INTERMED. LAYER COMP. | INTERMED. LAYER THICKNESS (nm) | COATING COMPOSITION | BARREL FINISHING? | DEGREE OF FLANK WEAR | ADHERENCE OF WORK MATERIAL? | |
|---|---|---|---|---|---|---|---|
| 1 | Ti | 90 | $(Al_{0.6}Ti_{0.4})(N_{0.8}C_{0.2})$ | YES | 0.28 | NO | PRIOR ART |
| 2 | — | 0 | $(Al_{0.6}Ti_{0.4})(N_{0.8}C_{0.2})$ | YES | 0.38 | NO | PRIOR ART |
| 3 | $Al_{0.6}Ti_{0.4}$ | 110 | $(Al_{0.6}Ti_{0.4})(N_{0.8}C_{0.2})$ | YES | 0.09 | NO | INVENTION |
| 4 | $Al_{0.6}Ti_{0.4}$ | 540 | $(Al_{0.6}Ti_{0.4})(N_{0.8}C_{0.2})$ | YES | 0.24 | NO | COMP. EX. |
| 5 | Ti | 100 | $(Al_{0.6}Ti_{0.4})N$ | NO | 0.42 | YES | PRIOR ART |
| 6 | $Al_{0.6}Ti_{0.4}$ | 130 | $(Al_{0.6}Ti_{0.4})N$ | NO | 0.12 | YES | INVENTION |
| 7 | $Al_{0.6}Ti_{0.4}$ | 530 | $(Al_{0.6}Ti_{0.4})N$ | NO | 0.30 | YES | COMP. EX. |

As is clear from Table 5, the degree of Flank wear after cutting is great for Examples No. 1, 2, and 5, but in the case of those examples fulfilling the requirements of this invention i.e. No. 3 and No. 6, the degree of flank wear is extremely small, indicating excellent wear resistant properties. This is because the degree of adhesion of the coating to the substrate is enhanced in the examples according to this invention, and thus peeling and consequent chipping of the cutting edge during the cutting operation do not occur, and excellent wear resistance properties are exhibited.

In the case of Example No. 3 particularly, almost all the macro-particles on the surface of the coating were removed by the barrel finishing process, leaving craters of a depth in the range of 0.2-2 μm, resulting in a surface of low roughness, and thus there was no adherence of the work 4. The coated member according to claim 1 or 2 wherein said coated member is a roughing end mill; and said substrate is made from a high speed steel having V and Co included in amounts given by the following expression;

0<(percentage weight of V+percentage weight of Co)<15.

5. The coated member according to claim 1 or 2 wherein said hard coating is further characterised in that there are no macro-particles protruding from the surface of the hard coating to any substantial extent, and that craters of a depth in the range of 0.2-2 μm exist on the surface of the hard coating.

6. The coated member according to claim 1 or 2 wherein said intermediate layer and hard coating are formed using an arc discharge ion-plating method.

7. The coated member of claim 4, wherein said substrate has a hardness equal to or greater than HV 900.

8. The coated member of claim 1, wherein said intermediate layer further comprises carbon and oxygen.

9. The coated member of claim 1, wherein said intermediate layer consists of aluminum, titanium, oxygen and carbon.

10. The coated member of claim 1, wherein said hard coating has a thickness of 2–8 μm.

11. The coated member of claim 1, wherein said intermediate layer has a composition given by the following expression, $Al_zTi_{1-z}$, where $0.50 \leq z \leq 0.65$

* * * * *